United States Patent
Tu et al.

(10) Patent No.: US 11,177,302 B2
(45) Date of Patent: Nov. 16, 2021

(54) CMOS IMAGE SENSOR STRUCTURE WITH MICROSTRUCTURES FORMED ON SEMICONDUCTOR LAYER

(71) Applicant: TAIWAN SEMICONDUCTOR MANUFACTURING CO., LTD., Hsinchu (TW)

(72) Inventors: Chien-Nan Tu, Kaohsiung (TW); Yu-Lung Yeh, Kaohsiung (TW); Hsing-Chih Lin, Tainan (TW); Chien-Chang Huang, Tainan (TW); Shih-Shiung Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/219,492

(22) Filed: Dec. 13, 2018

(65) Prior Publication Data
US 2019/0131334 A1    May 2, 2019

Related U.S. Application Data

(62) Division of application No. 15/796,693, filed on Oct. 27, 2017, now Pat. No. 10,157,946, which is a division of application No. 14/460,051, filed on Aug. 14, 2014, now Pat. No. 9,818,779.

(60) Provisional application No. 61/971,445, filed on Mar. 27, 2014.

(51) Int. Cl.
*H01L 27/146* (2006.01)

(52) U.S. Cl.
CPC .. *H01L 27/14625* (2013.01); *H01L 27/14621* (2013.01); *H01L 27/14645* (2013.01); *H01L 27/14683* (2013.01); *H01L 27/14685* (2013.01); *H01L 27/14689* (2013.01)

(58) Field of Classification Search
CPC ........................................ H01L 27/146–14698
See application file for complete search history.

(56) References Cited

U.S. PATENT DOCUMENTS

| 6,861,686 B2 | 3/2005 | Lee et al. |
| 7,314,782 B2 | 1/2008 | Dekker et al. |
| 7,759,755 B2 | 7/2010 | Adkisson et al. |
| 8,207,590 B2 | 6/2012 | Park et al. |

(Continued)

FOREIGN PATENT DOCUMENTS

| CN | 1518119 A | 8/2004 |
| CN | 101937921 A | 1/2011 |

(Continued)

*Primary Examiner* — Laura M Menz
*Assistant Examiner* — Candice Chan
(74) *Attorney, Agent, or Firm* — Maschoff Brennan

(57) ABSTRACT

A semiconductor device includes a device layer, a semiconductor layer, a sensor element, a dielectric layer, a color filter layer, and a micro-lens. The semiconductor layer is over the device layer. The semiconductor layer has a plurality of microstructures thereon. Each of the microstructures has a substantially triangular cross-section. The sensor element is under the microstructures of the semiconductor layer and is configured to sense incident light. The dielectric layer is over the microstructures of the semiconductor layer. The color filter layer is over the dielectric layer. The micro-lens is over the color filter layer.

20 Claims, 9 Drawing Sheets

(56) References Cited

U.S. PATENT DOCUMENTS

| | | |
|---|---|---|
| 9,337,227 B2 | 5/2016 | Lee |
| 2007/0145437 A1* | 6/2007 | Kim .................. H01L 27/14629 |
| | | 257/290 |
| 2009/0189234 A1 | 7/2009 | Mabuchi |
| 2009/0286346 A1* | 11/2009 | Adkisson .......... H01L 27/14632 |
| | | 438/65 |
| 2010/0006969 A1 | 1/2010 | Park et al. |
| 2011/0001038 A1 | 1/2011 | Tseng et al. |
| 2011/0019050 A1 | 1/2011 | Yamashita |

FOREIGN PATENT DOCUMENTS

| | | |
|---|---|---|
| CN | 103500748 A | 1/2014 |
| EP | 1439582 A2 | 7/2004 |
| TW | 200414278 A | 8/2004 |

\* cited by examiner

CMOS IMAGE SENSOR STRUCTURE WITH MICROSTRUCTURES FORMED ON SEMICONDUCTOR LAYER

PRIORITY CLAIM AND CROSS-REFERENCE

This application is a divisional application of U.S. patent application Ser. No. 15/796,693, filed on Oct. 27, 2017, now U.S. Pat. No. 10,157,946, issued on Dec. 18, 2018, which is a divisional application of U.S. patent application Ser. No. 14/460,051, filed on Aug. 14, 2014, now U.S. Pat. No. 9,818,779, issued on Nov. 14, 2017, which claims priority to U.S. provisional application Ser. No. 61/971,445 filed on Mar. 27, 2014, all of which are incorporated herein by reference in their entireties.

BACKGROUND

Semiconductor image sensors are operated to sense light. Typically, the semiconductor image sensors include complementary metal-oxide-semiconductor (CMOS) image sensors (CIS) and charge-coupled device (CCD) sensors, which are widely used in various applications such as digital still camera (DSC), mobile phone camera, digital video (DV) and digital video recorder (DVR) applications. These semiconductor image sensors utilize an array of image sensor elements, each image sensor element including a photodiode and other elements, to absorb light and convert the sensed light into digital data or electrical signals.

Back side illuminated (BSI) CMOS image sensors are one type of CMOS image sensors. The BSI CMOS image sensors are operable to detect light projected from their backside. The BSI CMOS image sensors can shorten optical paths and increase fill factors to improve light sensitivity per unit area and quantum efficiency, and can reduce cross talk and photo response non-uniformity. Hence, the image quality of the CMOS image sensors can be significantly improved. Furthermore, the BSI CMOS image sensors have high chief ray angles, which allow shorter lens heights to be implemented, so that thinner camera modules are achieved. Accordingly, the BSI CMOS image sensor technology is becoming a mainstream technology.

However, while existing BSI CMOS image sensors have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
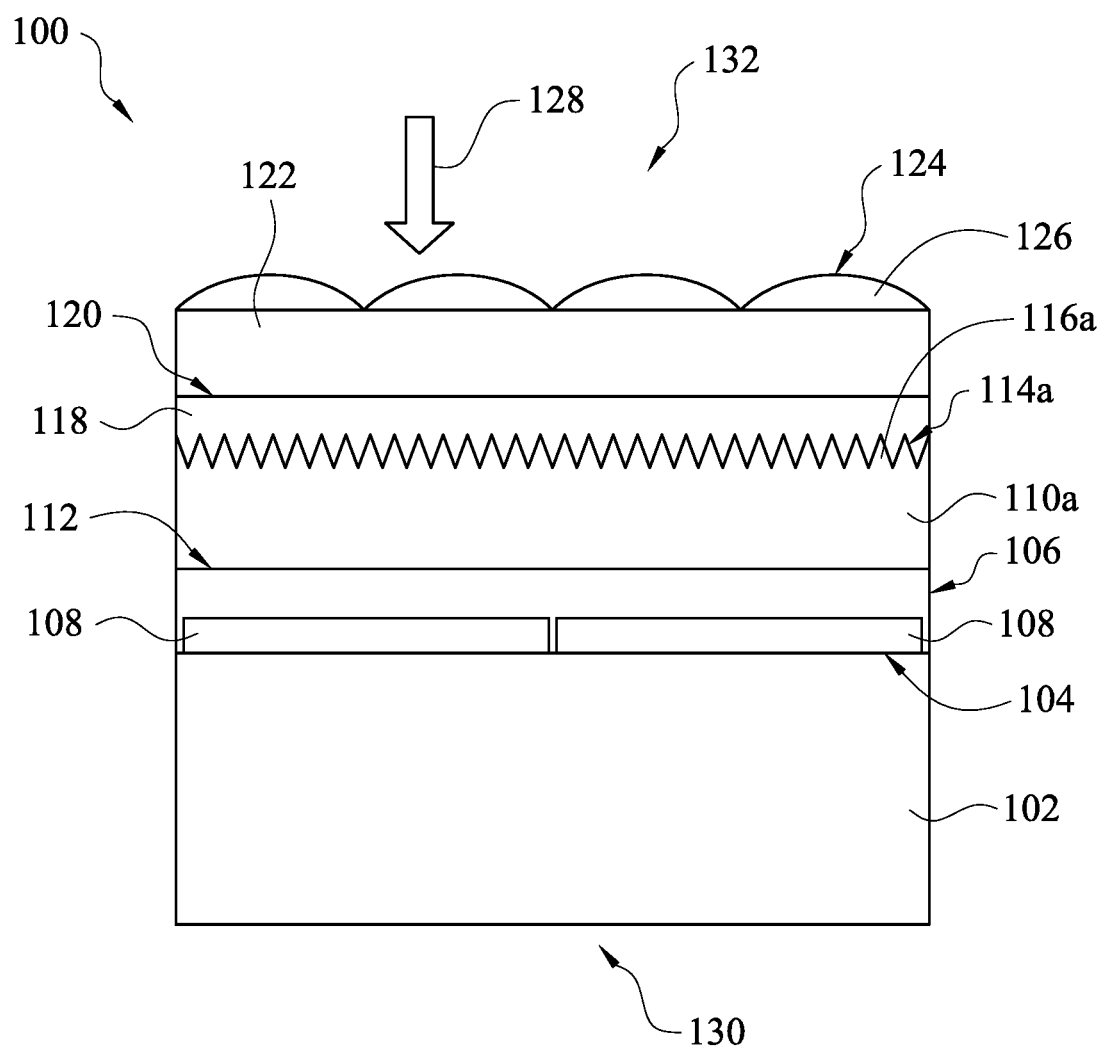
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical BSI CMOS image sensor, before light, which is projected from its backside and passes through a color filter layer, enters a semiconductor layer between the color filter layer and an underlying device layer, the light collides a planar surface of the semiconductor layer, and most of the light is reflected by the planar surface of the semiconductor layer. Hence, a quantum efficiency of the BSI CMOS image sensor is decreased due to high light reflection by the semiconductor layer and low light absorption in the device layer.

Embodiments of the present disclosure are directed to providing a semiconductor device and a method for manufacturing the semiconductor device, in which a semiconductor layer between a color filter layer and a device layer has a surface on which microstructures are formed, so that most of light can be refracted by the microstructures, enter the semiconductor layer and be absorbed by the device layer. Accordingly, quantum efficiency of the semiconductor device is significantly enhanced due to low reflection and high absorption.

FIG. 1 is schematic cross-sectional view of a semiconductor device in accordance with various embodiments. In some embodiments, a semiconductor device 100 is a CMOS image sensor device, which may be operated for sensing incident light 128. The semiconductor device 100 has a front side 130 and a back side 132. In certain embodiments, the semiconductor device 100 is a BSI CMOS image sensor device, which is operated to sense the incident light 128 projected from its back side 132. As shown in FIG. 1, a semiconductor device 100 includes a substrate 102, a device layer 106, a semiconductor layer 110a and a color filter layer 122. The substrate 102 is a semiconductor substrate. The substrate 102 is composed of a single-crystalline semiconductor material or a compound semiconductor material. In some examples, the substrate 102 is a silicon substrate. In some embodiments, germanium or glass may also be used as a material of the substrate 102.

In some embodiments, the device layer 106 is disposed on a surface 104 of the substrate 102. In an alternative embodiment, a passivation layer (not shown) is additionally formed between the device layer 106 and the substrate 102. The device layer 106 includes light-sensing regions 108. In some examples, each light-sensing region 108 includes a pixel including an image sensor element, in which the image sensor element includes a photodiode and other elements. The light-sensing region 108 is operated to sense the incident light 128.

Figure 2A:
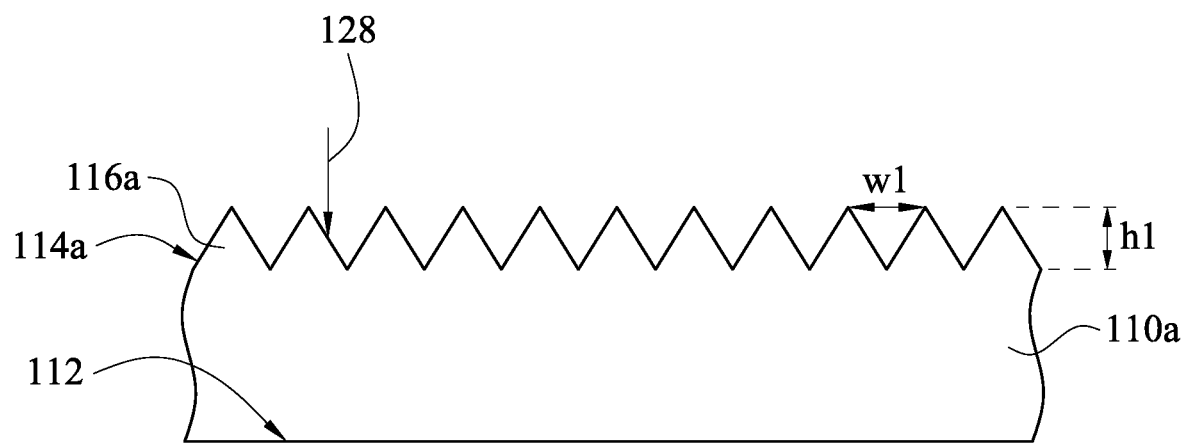
FIG. 2A is an enlarged schematic cross-sectional view of a semiconductor layer of a semiconductor device in accordance with various embodiments.
Figure 2B:
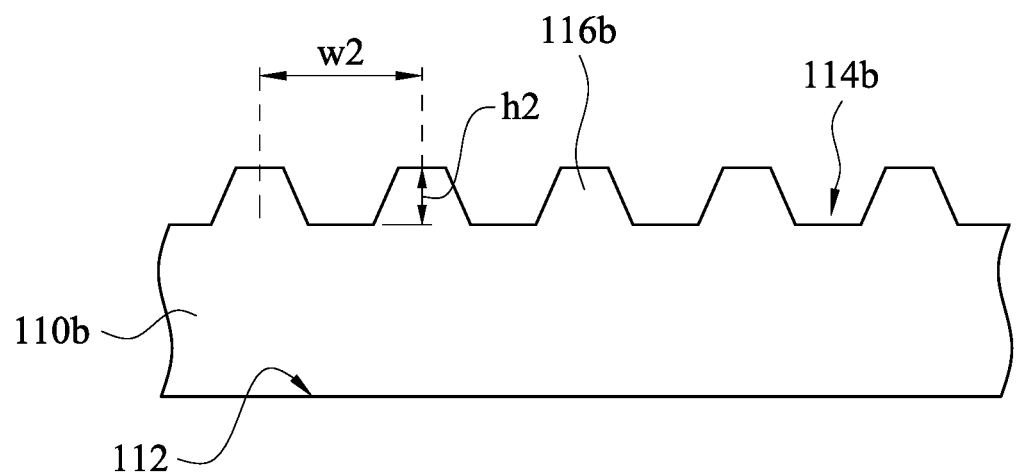
FIG. 2B is an enlarged schematic cross-sectional view of a semiconductor layer of a semiconductor device in accordance with various embodiments.

The semiconductor layer 110a overlies the device layer 106. In some embodiments, the semiconductor layer 110a is formed from silicon, germanium, epitaxial silicon and/or epitaxial germanium. The semiconductor layer 110a has a first surface 112 and a second surface 114a opposite to the first surface 112, and the first surface 112 is adjacent to the device layer 106. The semiconductor layer 110a includes microstructures 116a formed on the second surface 114a. Referring to FIG. 2A and FIG. 2B, FIG. 2A is an enlarged schematic cross-sectional view of a semiconductor layer of a semiconductor device in accordance with various embodiments and FIG. 2B is an enlarged schematic cross-sectional view of a semiconductor layer of a semiconductor device in accordance with various embodiments. In some embodiments, each microstructure 116a has a cross-section in a shape of triangle, trapezoid or arc, such as semi-circle or semi-ellipse. For example, each microstructure 116a has a cross-section in a shape of triangle as shown in FIG. 2A, and each microstructure 116b formed on a second surface 114b of a semiconductor layer 110b has a cross-section in a shape of trapezoid as shown in FIG. 2B. In the examples, the semiconductor layer 110b is similar to the semiconductor layer 110a and overlies the device layer 106, and a first surface 112 of the semiconductor layer 110b is opposite to the second surface 114b and adjacent to the device layer 106. Similarly, the semiconductor layer 110b may be formed from silicon, germanium, epitaxial silicon and/or epitaxial germanium.

In some examples, the microstructures 116a or 116b are regularly arranged. In some examples, the microstructures 116a or 116b are irregularly arranged. In addition, as shown in FIG. 2A, any two adjacent ones of the microstructures 116a may adjoin to each other. In some examples, as shown in FIG. 2B, any two adjacent ones of the microstructures 116b are separated from each other. In the semiconductor layer 110a shown in FIG. 2A, each microstructure 116a has a height h1, and a pitch w1 is formed between any two adjacent ones of the microstructures 116a. In some examples, the height h1 is between $100\lambda$ and $\lambda/100$, and the pitch w1 is between $100\lambda$ and $\lambda/100$, $\lambda$ representing a wavelength of the incident light 128. In certain examples, the height h1 is greater than $\lambda/2.5$, and the pitch w1 is greater than $\lambda/2$. In the semiconductor layer 110b shown in FIG. 2B, each microstructure 116b has a height h2, and a pitch w2 is formed between any two adjacent ones of the microstructures 116b. In some examples, the height h2 is between $100\lambda$ and $\lambda/100$, and the pitch w2 is between $100\lambda$ and $\lambda/100$. In certain examples, the height h2 is greater than $\lambda/2.5$, and the pitch w2 is greater than $\lambda/2$.

With the microstructures 116a or 116b, an area of the second surface 114a or 114b is increased, and an incident angle of the incident light 128 projected to the second surface 114a or 114b is smaller than that of the incident light 128 projected to a planar surface, so that most of the incident light 128 can be multiply refracted in the microstructures 116a, and then passes through the semiconductor layer 110a or 110b to the device layer 106, and is absorbed by the device layer 106. Hence, the absorption ratio of the incident light 128 is significantly raised.

In some embodiments, the color filter layer 122 is formed on the second surface 114a of the semiconductor layer 110a. The color filter layer 122 includes various color filters, such as red color filters, green color filters and blue color filters, which are arranged in an array. In some embodiments, as shown in FIG. 1, the semiconductor device 100 optionally includes a dielectric layer 118 formed to cover the second surface 114a of the semiconductor layer 110a. In some examples, the dielectric layer 118 is formed from silicon oxide, silicon nitride or silicon oxynitride. A surface 120 of the dielectric layer 118 is planar, and the color filter layer 122 is formed on the planar surface 120 of the dielectric layer 118.

Referring to FIG. 1 again, in some embodiments, the semiconductor device 100 optionally includes a micro-lens layer 124. The micro-lens layer 124 is formed on the color filter layer 122. The micro-lens layer 124 includes micro-lenses 126. The micro-lenses 126 may direct and focus the incident light 128 toward the light-sensing regions 108 in the device layer 106. The micro-lenses 126 may be arranged in various forms with various shapes depending on a refractive index of the micro-lenses 126 and distances between the light-sensing region 108 and the micro-lenses 126.

Figure 3A:
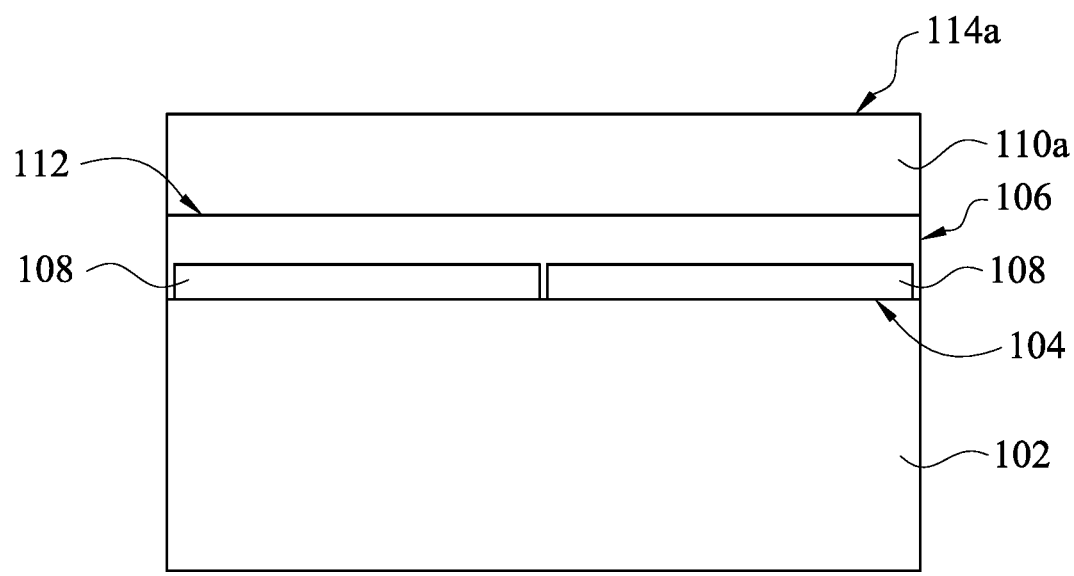
FIG. 3A through FIG. 3D are schematic cross-sectional views of intermediate stages showing a method for manufacturing a semiconductor device in accordance with various embodiments.

Referring to FIG. 3A through FIG. 3D, FIG. 3A through FIG. 3D are schematic cross-sectional views of intermediate stages showing a method for manufacturing a semiconductor device in accordance with various embodiments. As shown in FIG. 3A, a substrate 102 is provided. The substrate 102 is composed of a single-crystalline semiconductor material or a compound semiconductor material. In some embodiments, silicon, germanium or glass is used as a material forming the substrate 102. A device layer 106 and a semiconductor layer 110a are sequentially formed on a surface 104 of the substrate 102. The semiconductor layer 110a has a first surface 112 and a second surface 114a opposite to the first surface 112. In some embodiments, the device layer 106 is firstly formed on the first surface 112 of the semiconductor layer 110a, and then the device layer 106 is adhered to the surface 104 of the substrate 102 by using, for example, a bonding technique. In some examples, a thinning process is optionally performed on the second surface 114a of the semiconductor layer 110a to reduce a thickness of the semiconductor layer 110a. In certain examples, the semiconductor layer 110a is formed on a temporary substrate (not shown), and the device layer 106 is formed on the first surface 112 of the semiconductor layer 110a, and the device layer 106 is bonded to the surface 104 of the substrate 102, and then a thinning process is performed to remove the temporary substrate, in which the semiconductor layer 110a may be thinned. The thinning process may be performed using a chemical mechanical polishing (CMP) technique.

In some embodiments, the device layer 106 includes light-sensing regions 108. Each light-sensing region 108 may include a pixel including an image sensor element, and the image sensor element includes a photodiode and other elements. In some examples, the semiconductor layer 110a is formed from silicon, germanium, epitaxial silicon and/or epitaxial germanium.

Figure 3B:
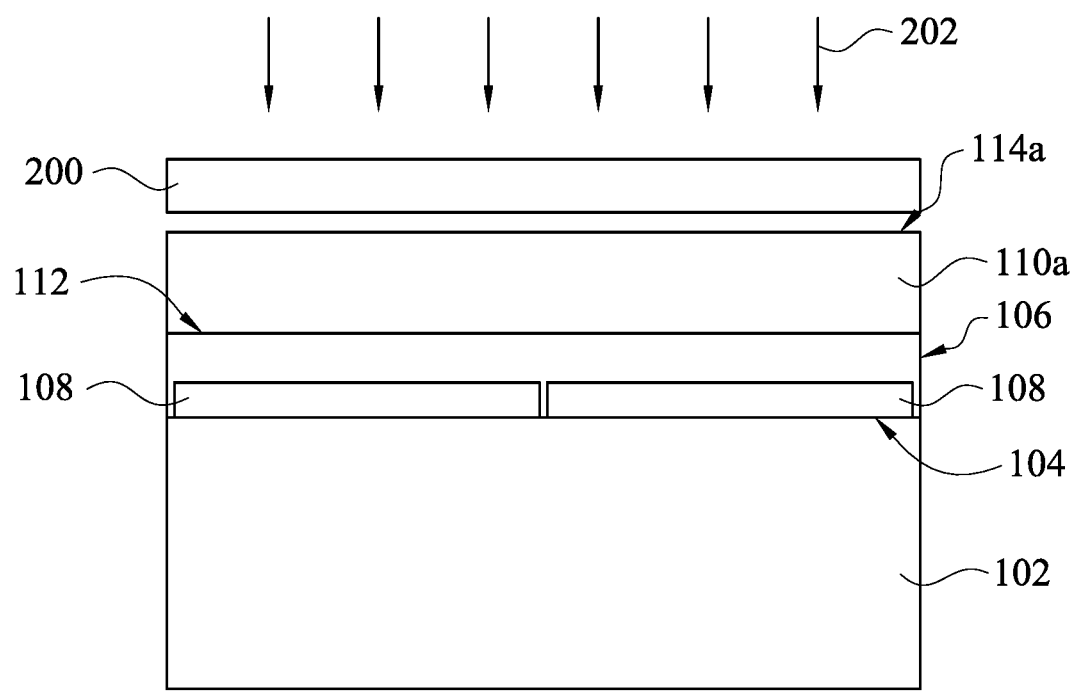
Figure 3C:
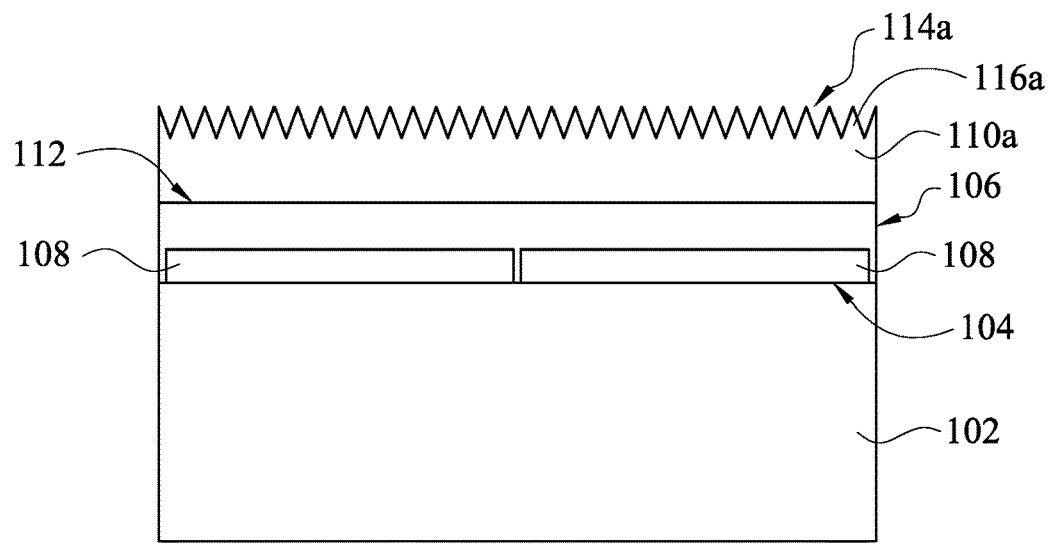

As shown in FIG. 3C, microstructures 116a are formed on the second surface 114a of the semiconductor layer 110a. In some embodiments, as shown in FIG. 3B and FIG. 3C, the operation of forming the microstructures 116a is performed using a photolithography process and an etching process, in which the photolithography process is performed to define regions where the microstructures 116a are formed by projecting light 202 through a photo mask 200 toward the second surface 114a, and the etching process is performed on the second surface 114a to remove a portion of the semiconductor layer 110a so as to form the microstructures 116a on the second surface 114a according to the definition of the photolithography process. In some examples, the etching process is performed using a dry etching technique or a chemical etching technique. In certain examples, the microstructures 116a are formed using a laser removing technique.

Each microstructure 116a may be formed with a cross-section in a shape of triangle, trapezoid or arc, such as semi-circle or semi-ellipse. The microstructures 116a are formed regularly. In some examples, the microstructures 116a are formed irregularly. In some embodiments, simultaneously referring to FIG. 2A and FIG. 3C, the operation of forming the microstructures 116a is performed to form any two adjacent ones of the microstructures 116a adjoining to each other. Referring to FIG. 2B, in the operation of forming the microstructures 116b, any two adjacent ones of the microstructures 116b may be separated from each other. Each microstructure 116a has a height h1, and a pitch w1 is formed between any two adjacent ones of the microstructures 116a. In some examples, the height h1 is between $100\lambda$ and $\lambda/100$, and the pitch w1 is between $100\lambda$ and $\lambda/100$, $\lambda$ representing a wavelength of the incident light 128. In certain examples, the height h1 is greater than $\lambda/2.5$, and the pitch w1 is greater than $\lambda/2$.

Figure 3D:
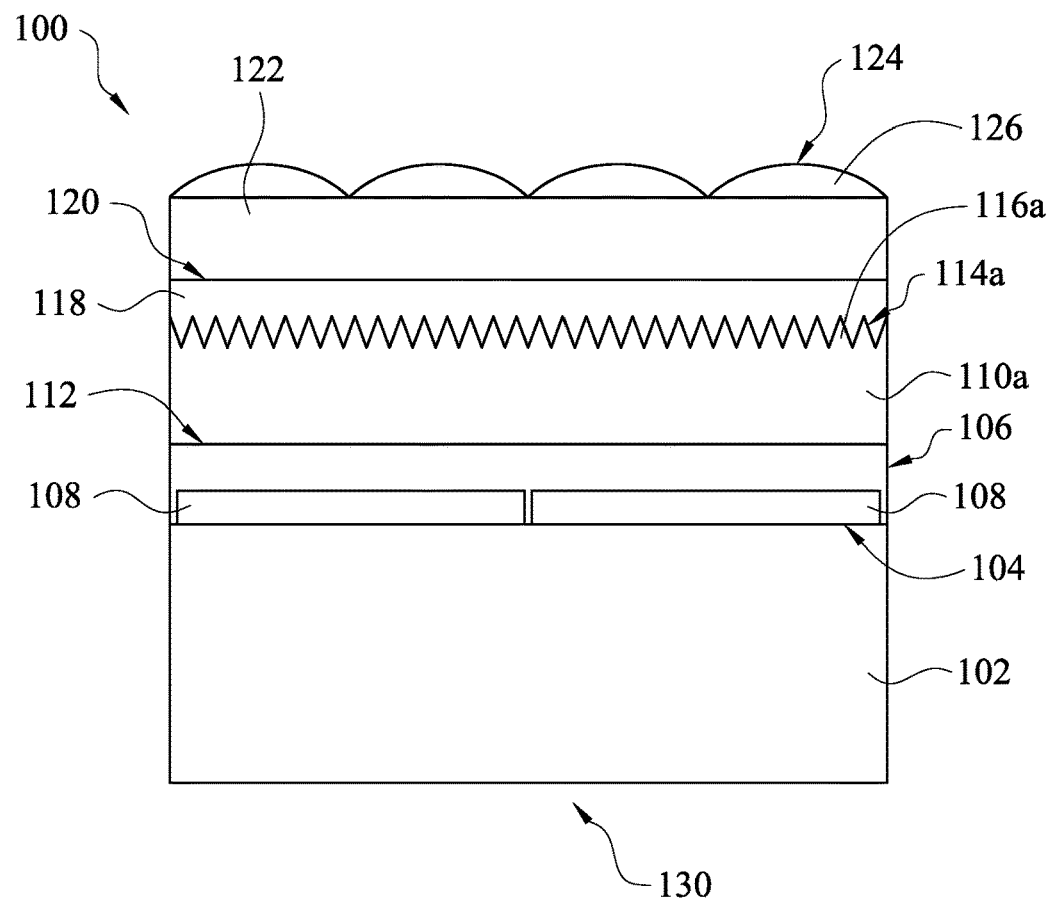

In some embodiments, after the microstructures 116a are formed, a color filter layer 122 is formed on the second surface 114a of the semiconductor layer 110a. The color filter layer 122 includes various color filters, such as red color filters, green color filters and blue color filters, which are arranged in an array. In some embodiments, as shown in FIG. 3D, after the microstructures 116a are formed, a dielectric layer 118 is formed to cover the second surface 114a of the semiconductor layer 110a and to fill the gap between any two adjacent ones of the microstructures 116a, and the color filter layer 122 is formed on the dielectric layer 118. The dielectric layer 118 may be formed from silicon oxide, silicon nitride or silicon oxynitride. The dielectric layer 118 has a planar surface 120, and the color filter layer 122 is formed on the planar surface 120. In some examples, the operation of forming the dielectric layer 118 is performed using a thermal oxide technique or a deposition technique, such as a chemical vapor deposition (CVD) technique. In certain examples, after the dielectric layer 118 is formed, a planarization process is performed on the dielectric layer 118 to form the dielectric layer 118 having the planar surface 120. The planarization process may be performed using a chemical mechanical polishing technique.

In some embodiments, after the color filter layer 122 is formed, a micro-lens layer 124 including micro-lenses 126 is optionally formed on the color filter layer 122 to complete the semiconductor device 100. The operation of forming the micro-lenses 126 may be performed to form the micro-lenses 126 in various arrangements and various shapes depending on a refractive index of the micro-lenses 126 and distances between the light-sensing region 108 and the micro-lenses 126.

Figure 4:
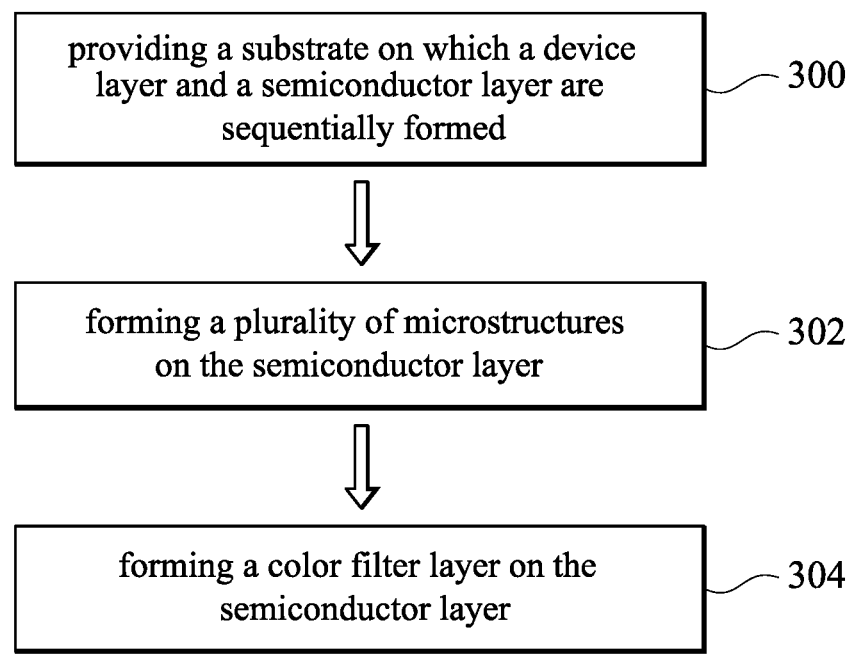
FIG. 4 is a flow chart of a method for manufacturing a semiconductor device in accordance with various embodiments.

Referring to FIG. 4 with FIG. 3A through FIG. 3D, FIG. 4 is a flow chart of a method for manufacturing a semiconductor device in accordance with various embodiments. The method begins at operation 300, where a substrate 102 is provided, and a device layer 106 and a semiconductor layer 110a are sequentially formed on a surface 104 of the substrate 102, as shown in FIG. 3A. The semiconductor layer 110a has a first surface 112 and a second surface 114a opposite to the first surface 112. In some embodiments, the device layer 106 is formed on the first surface 112 of the semiconductor layer 110a, and the device layer 106 is adhered to the surface 104 of the substrate 102 by using, for example, a bonding method. Optionally, a thinning process is performed on the second surface 114a of the semiconductor layer 110a to reduce a thickness of the semiconductor layer 110a.

At operation 302, as shown in FIG. 3B and FIG. 3C, microstructures 116a are formed on the second surface 114a of the semiconductor layer 110a by using, for example, a photolithography process and an etching process. In some examples, the etching process is performed using a dry etching technique or a chemical etching technique. In certain examples, the microstructures 116a are formed using a laser removing technique. The operation of forming the microstructures 116a may be performed to form each microstructure 116a with a cross-section in a shape of triangle, trapezoid or arc, such as semi-circle or semi-ellipse. The microstructures 116a may be formed regularly. In some examples, the microstructures 116a are formed irregularly.

In some embodiments, the operation of forming the microstructures 116a is performed to form any two adjacent ones of the microstructures 116a adjoining to each other, as shown in FIG. 2A. Alternately, as shown in FIG. 2B, any two adjacent ones of the microstructures 116b may be formed to be separated from each other. In some examples, the height of each microstructure 116a is between $100\lambda$ and $\lambda/100$, and the pitch between any two adjacent ones of the microstructures 116a is between $100\lambda$ and $\lambda/100$, $\lambda$ representing a wavelength of the incident light. In certain examples, the height of each microstructure 116a is greater than $\lambda/2.5$, and the pitch between any two adjacent ones of the microstructures 116a is greater than $\lambda/2$.

At operation 304, a color filter layer 122 is formed on the second surface 114a of the semiconductor layer 110a. The color filter layer 122 includes various color filters, such as red color filters, green color filters and blue color filters, which are arranged in an array. In some embodiments, as shown in FIG. 3D, a dielectric layer 118 is firstly formed to cover the second surface 114a of the semiconductor layer 110a and to fill the gap between any two adjacent ones of the microstructures 116a using a thermal technique or a deposition technique, and the color filter layer 122 is formed on the dielectric layer 118. The dielectric layer 118 has a planar surface 120 formed by a planarization process, and the color filter layer 122 is formed on the planar surface 120. In some embodiments, a micro-lens layer 124 including micro-lenses 126 is optionally formed on the color filter layer 122 to complete the semiconductor device 100.

Figure 5A:
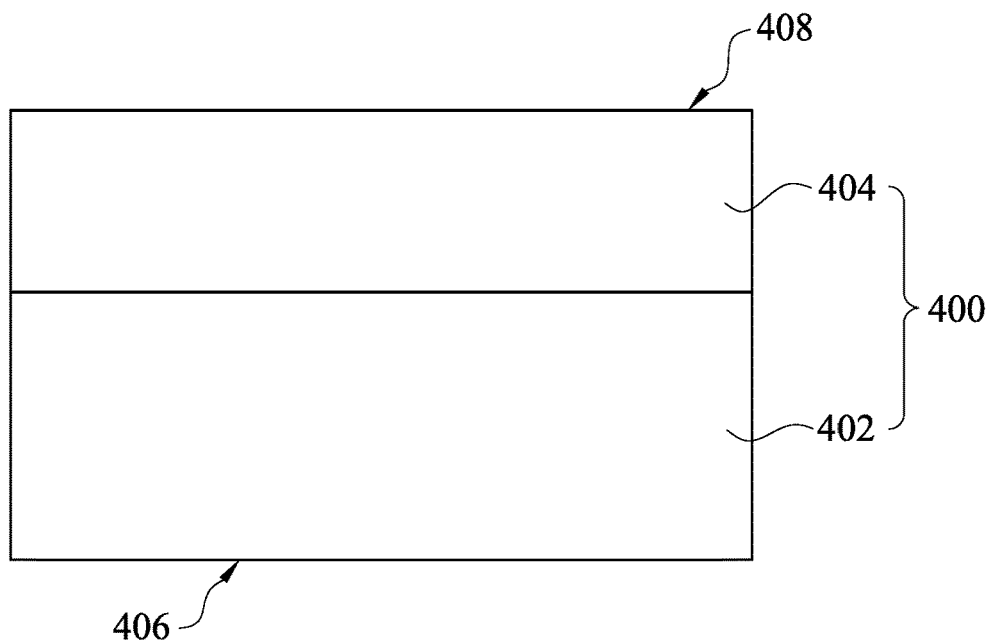
FIG. 5A through FIG. 5F are schematic cross-sectional views of intermediate stages showing a method for manufacturing a semiconductor device in accordance with various embodiments.

FIG. 5A through FIG. 5F are schematic cross-sectional views of intermediate stages showing a method for manufacturing a semiconductor device in accordance with various embodiments. As shown in FIG. 5A, a first substrate 400 is provided. The first substrate 400 has a first surface 406 and a second surface 408 which are two opposite sides of the first substrate 400. The first substrate 400 may be composed of a single-layered structure. In some embodiments, as shown in FIG. 5A, the first substrate 400 includes a first layer 402 and a second layer 404 stacked on the first layer 402. The first layer 402 and the second layer 404 are composed of single-crystalline semiconductor materials or compound semiconductor materials. In some examples, silicon, germanium, epitaxial silicon, epitaxial germanium or glass is used as materials forming the first layer 402 and the second layer 404. The first layer 402 and the second layer 404 may be formed from different materials, for example, the first layer 402 is formed from silicon and the second layer 404 is formed from epitaxial silicon. In certain examples, the first layer 402 and the second layer 404 may be formed from the same material.

Figure 5B:
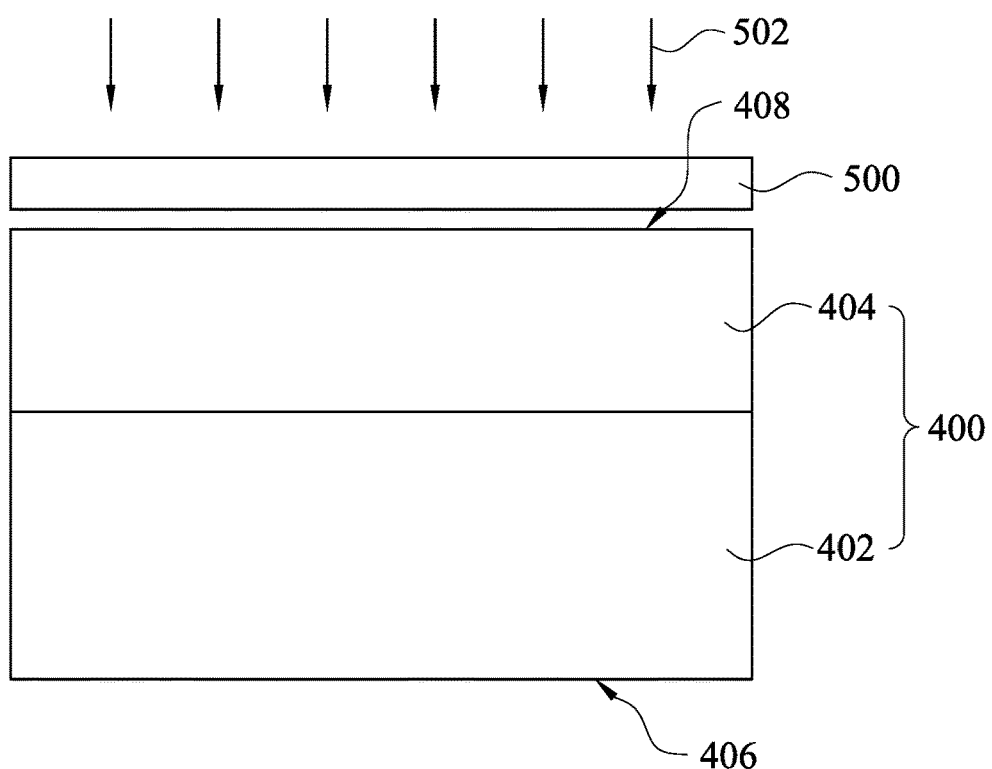
Figure 5C:
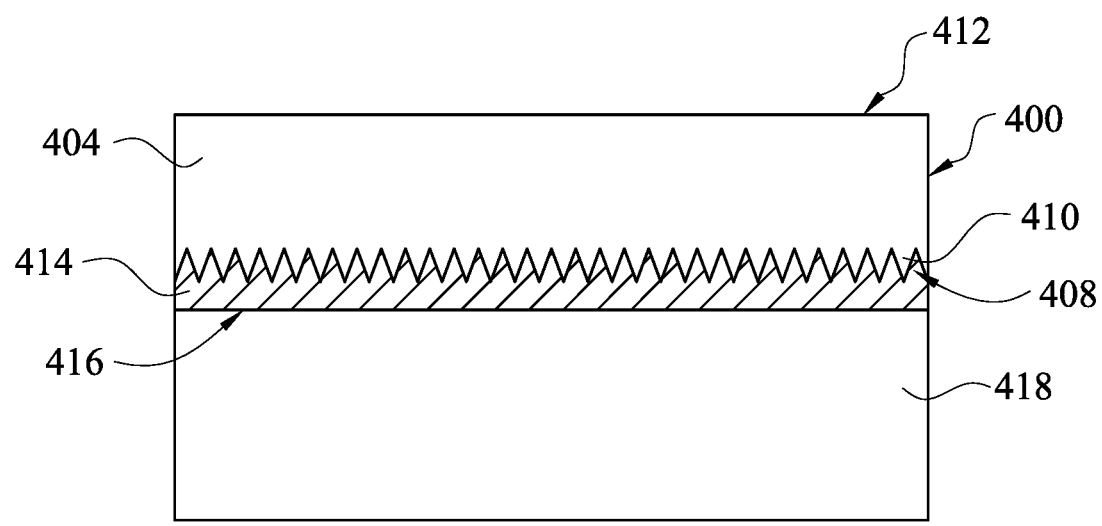

As shown in FIG. 5C, microstructures 410 are formed on the second surface 408 of the first substrate 400, in which the microstructures 410 are formed on the second layer 404. In some embodiments, as shown in FIG. 5B and FIG. 5C, the operation of forming the microstructures 410 is performed using a photolithography process and an etching process, in which the photolithography process is performed by projecting light 502 through a photo mask 500 toward the second surface 408, and the etching process is performed on the second surface 408 to remove a portion of the second layer 404 of the first substrate 400 to form the microstructures 410 on the second surface 408 according to the definition of the photolithography process. In some examples, the etching process is performed using a dry etching technique or a chemical etching technique. In certain examples, the microstructures 410 are formed using a laser removing technique.

In some examples, each microstructure 410 may be formed with a cross-section in a shape of triangle, trapezoid or arc, such as semi-circle or semi-ellipse. The microstructures 410 may be arranged regularly. In some examples, the microstructures 410 are arranged irregularly. In some embodiments, referring to FIG. 5C again, the operation of forming the microstructures 410 is performed to form any two adjacent ones of the microstructures 410 adjoining to each other. Simultaneously referring to FIG. 2B and FIG. 5C, the arrangement of the microstructures 410 may be similar to the microstructures 116b, in which any two adjacent ones of the microstructures 410 may be formed to be separated from each other. Similar to the microstructures 116a in FIG. 2A or the microstructures 116b in FIG. 2B, a height of each microstructure 410 may be between $100\lambda$ and $\lambda/100$, and a pitch between any two adjacent ones of the microstructures 410 may be between $100\lambda$ and $\lambda/100$, $\lambda$ representing a wavelength of the incident light. In certain examples, the height of each microstructure 410 is greater than $\lambda/2.5$, and the pitch $w1$ between any two adjacent ones of the microstructures 410 is greater than $\lambda/2$. The arrangements and the shapes of the microstructures 410 may be similar to those of the microstructures 116a in FIG. 2A or those of the microstructures 116b in FIG. 2B.

After the microstructures 410 are formed on the second surface 408 of the first substrate 400, a dielectric layer 414 is formed to cover the second surface 408 of the first substrate 400 and fills the gap between any two adjacent ones of the microstructures 410, as shown in FIG. 5C. In some examples, the operation of forming the dielectric layer 414 is performed using a thermal oxidation technique or a chemical vapor deposition technique. For example, the dielectric layer 414 is formed from oxide, such as silicon oxide. Optionally, a planarization operation is performed on the dielectric layer 414, so that a surface 416 of the dielectric layer 414 is planar. The planarization operation may be performed using a chemical mechanical polishing technique.

After the operation of forming the dielectric layer 414, a second substrate 418 is provided, and the second substrate 418 is bonded to the surface 416 of the dielectric layer 414. The surface 416 of the dielectric layer 414 is planarized to be planar, so that the second substrate 418 can be successfully and firmly bonded to the surface 416 of the dielectric layer 414. In some examples, the second substrate 418 is formed from glass or a semiconductor material such as silicon and germanium. Optionally, after the bonding operation, a thinning operation is performed on the first surface 406 of the first substrate 400 to remove a portion of the first substrate 400 by using, for example, a chemical mechanical polishing technique or an etching technique. In certain examples, as shown in FIG. 5C, the first layer 402 of the first substrate 400 is removed to expose a surface 412 of the second layer 404.

Figure 5D:
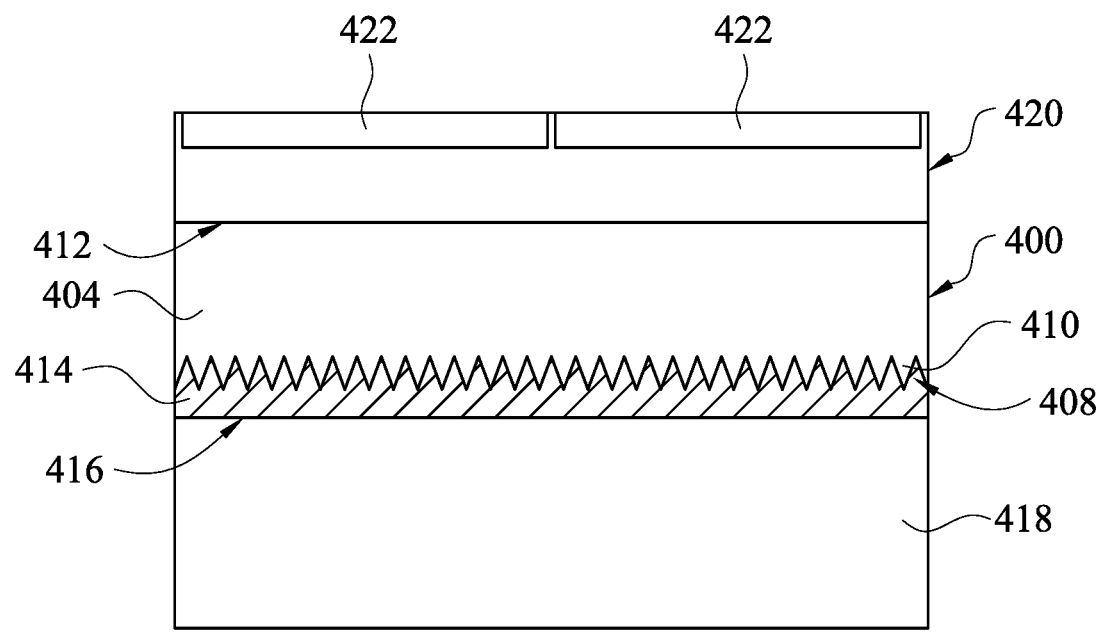

Then, as shown in FIG. 5D, a device layer 420 is formed on the surface 412 of the second layer 404 of the first substrate 400. The device layer 420 includes light-sensing regions 422. In some examples, each light-sensing region 422 includes a pixel, and the pixel includes an image sensor element which includes a photodiode and other elements.

Figure 5E:
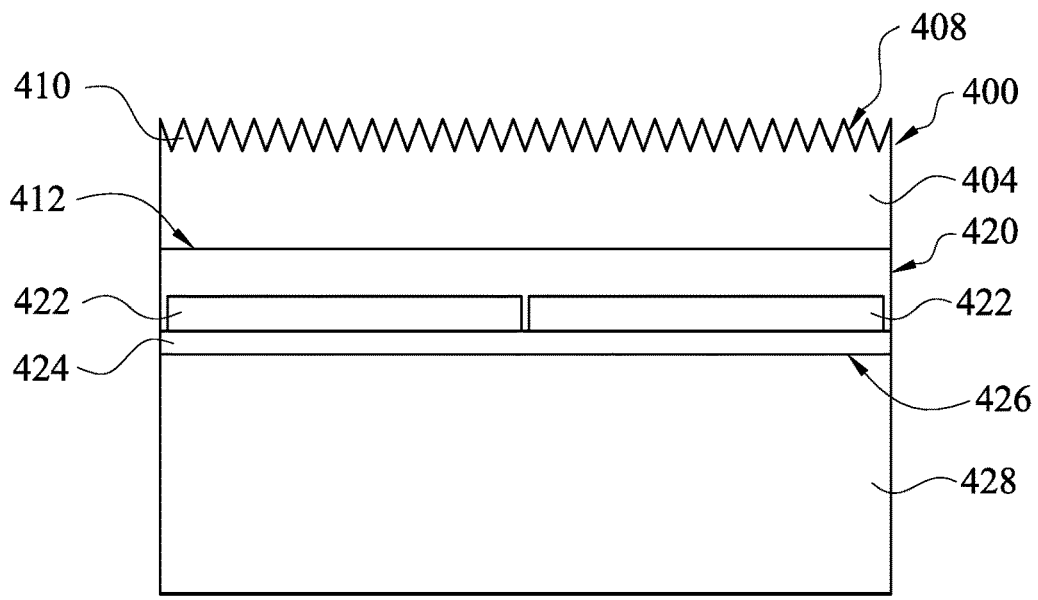

In some embodiments, after the device layer 420 is formed, a third substrate 428 is provided, and then the third substrate 428 is bonded to the device layer 420. For example, the third substrate 428 is formed from glass or a semiconductor material, such as silicon and germanium. In some embodiments, as shown in FIG. 5E, before the bonding operation of the third substrate 428, a passivation layer 424 is formed to cover the device layer 420. For example, the passivation layer 424 may be formed from silicon oxide, silicon nitride or silicon oxynitride. In some examples, a planarization operation is performed on the passivation layer 424, so that a surface 426 of the passivation layer 424 can be planar. The planarization operation may be performed using a chemical mechanical polishing technique. Because the surface 426 of the passivation layer 424 is planarized to be planar, the third substrate 428 can be successfully and firmly bonded to the surface 426 of the passivation layer 424.

After the bonding operation of the third substrate 428, a thinning operation is performed on the second substrate 418 to subsequently remove the second substrate 418 and the dielectric layer 414 by using, for example, a chemical mechanical polishing technique and/or an etching technique. After the thinning operation, the microstructures 410 on the second surface 408 of the first substrate 400 are exposed, as shown in FIG. 5E.

Figure 5F:
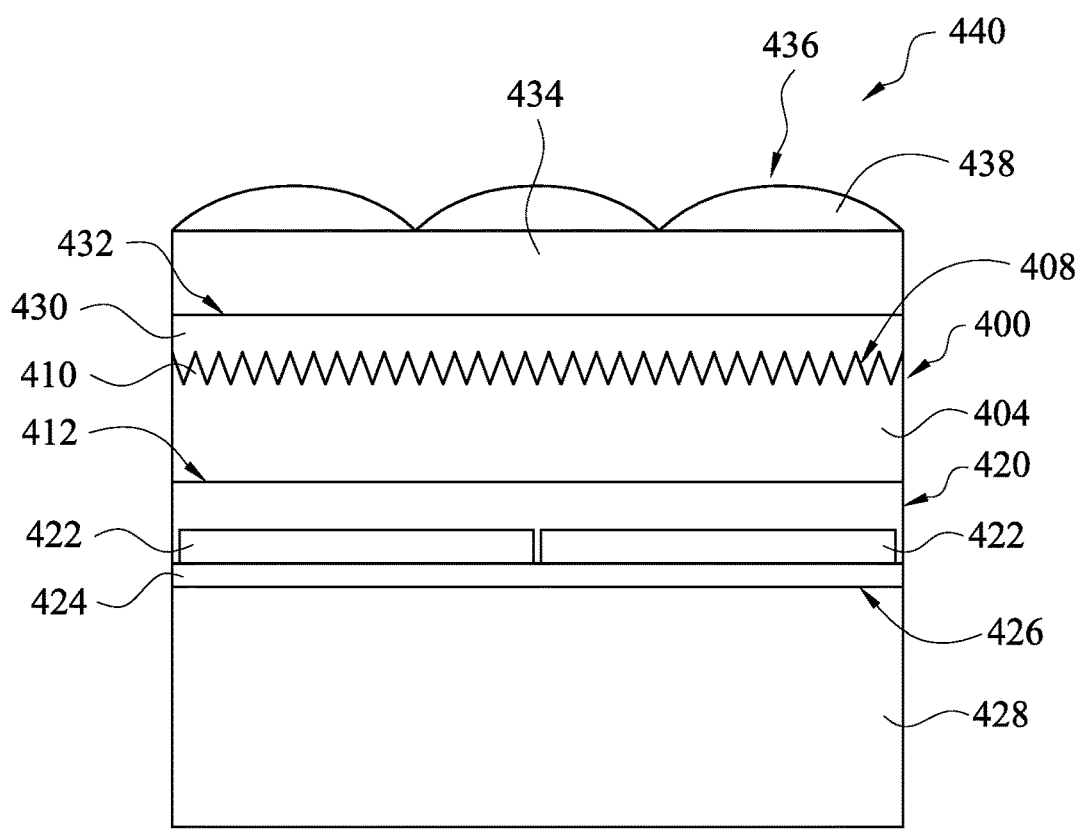

In some embodiments, after the microstructures 410 are exposed, a color filter layer 434 is formed on the second surface 408 of the first substrate 400. The color filter layer 434 includes various color filters, such as red color filters, green color filters and blue color filters, which are arranged in an array. In some embodiments, as shown in FIG. 5F, after the microstructures 410 are exposed, a dielectric layer 430 is formed to cover the second surface 408 of the first substrate 400 and to fill the gap between any two adjacent ones of the microstructures 410, and the color filter layer 434 is then formed on the dielectric layer 430. The dielectric layer 430 may be formed from silicon oxide, silicon nitride or silicon oxynitride. The dielectric layer 430 has a planar surface 432, and the color filter layer 434 is formed on the planar surface 432. The dielectric layer 430 may be formed by using a thermal oxidation technique or a deposition technique, such as a chemical vapor deposition technique. Optionally, after the dielectric layer 430 is formed, a planarization process is performed on the dielectric layer 430, so that the surface 432 of the dielectric layer 430 is planar. The planarization process may be performed using a chemical mechanical polishing technique.

In some embodiments, as shown in FIG. 5F again, after the color filter layer 434 is formed, a micro-lens layer 436 including micro-lenses 438 is formed on the color filter layer 434 to complete the semiconductor device 440. The operation of forming the micro-lenses 438 may be performed to form the micro-lenses 438 in various arrangements and various shapes depending on a refractive index of the micro-lenses 438 and distances between the light-sensing region 422 and the micro-lenses 438.

Figure 6:
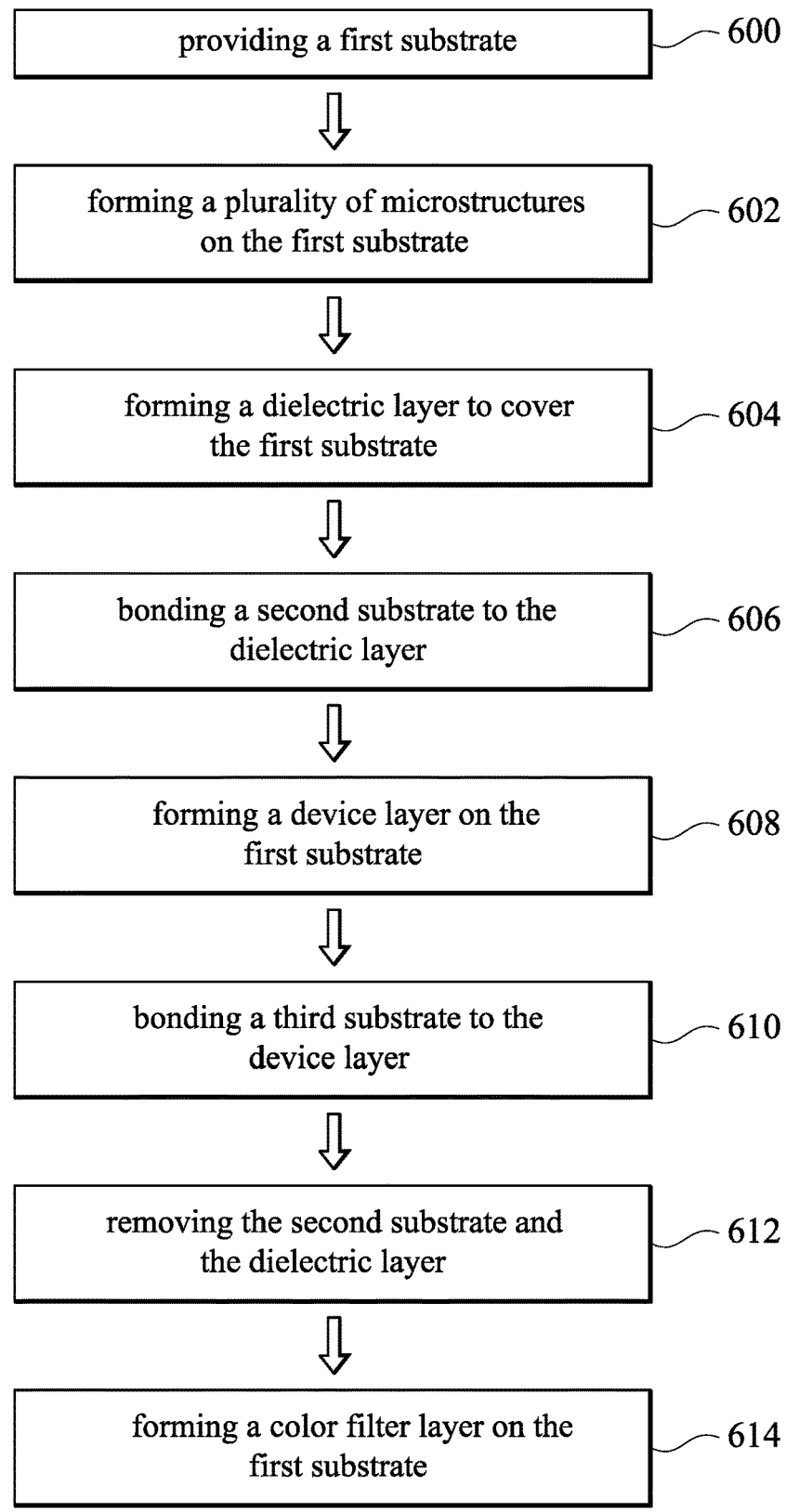
FIG. 6 is a flow chart of a method for manufacturing a semiconductor device in accordance with various embodiments.

Referring to FIG. 6 with FIG. 5A through FIG. 5F, FIG. 6 is a flow chart of a method for manufacturing a semiconductor device in accordance with various embodiments. The method begins at operation 600, where a first substrate 400 having a first surface 406 and a second surface 408 opposite to the first surface 406 is provided. The first substrate 400 may be composed of a single-layered structure. In some embodiments, as shown in FIG. 5A, the first substrate 400 includes a first layer 402 and a second layer 404 stacked on the first layer 402. The first layer 402 and the second layer 404 may be formed from different materials. In certain examples, the first layer 402 and the second layer 404 may be formed from the same material.

At operation 602, as shown in FIG. 5B and FIG. 5C, microstructures 410 are formed on the second surface 408 of the first substrate 400 by using, for example, a photolithography process and an etching process. In some examples, the etching process is performed using a dry etching technique or a chemical etching technique. The microstructures 410 may be formed using a laser removing technique. The operation of forming the microstructures 410 may be performed to form each microstructure 116a with a cross-section in a shape of triangle, trapezoid or arc, such as semi-circle or semi-ellipse. The microstructures 116a 410 may be formed regularly. In some examples, the microstructures 410 are formed irregularly.

In some embodiments, the operation of forming the microstructures 410 is performed to form any two adjacent ones of the microstructures 410 adjoining to each other, such as the microstructures 116a shown in FIG. 2A. Such as the microstructures 116b shown in FIG. 2B, any two adjacent ones of the microstructures 410 may be formed to be separated from each other. In some examples, the height of each microstructure 410 is between $100\lambda$ and $\lambda/100$, and the pitch between any two adjacent ones of the microstructures 410 is between $100\lambda$ and $\lambda/100$, $\lambda$ representing a wavelength of the incident light. In certain examples, the height of each microstructure 410 is greater than $\lambda/2.5$, and the pitch between any two adjacent ones of the microstructures 410 is greater than $\lambda/2$.

At operation 604, as shown in FIG. 5C, a dielectric layer 414 is formed to cover the second surface 408 of the first substrate 400. In some examples, the operation of forming the dielectric layer 414 is performed using a thermal oxidation technique or a chemical vapor deposition technique. Optionally, a planarization operation may be performed on the dielectric layer 414 by using, for example, a chemical mechanical polishing technique to form the dielectric layer 414 with a planar surface 416.

At operation 606, as shown in FIG. 5C again, a second substrate 418 is provided and bonded to the surface 416 of the dielectric layer 414. In some examples, the second substrate 418 is formed from glass or a semiconductor material. Optionally, a thinning operation is performed on the first surface 406 of the first substrate 400 to remove a portion of the first substrate 400 by using, for example, a chemical mechanical polishing technique or an etching technique. In certain examples, the first layer 402 of the first substrate 400 is removed to expose a surface 412 of the second layer 404. At operation 608, as shown in FIG. 5D, a device layer 420 is formed on the surface 412 of the second layer 404 of the first substrate 400. The device layer 420 includes light-sensing regions 422. Each light-sensing region 422 may include a pixel.

At operation 610, a third substrate 428 is provided and bonded to the device layer 420. The third substrate 428 may be formed from glass or a semiconductor material such as silicon and germanium. In some embodiments, as shown in FIG. 5E, a passivation layer 424 is formed to cover the device layer 420. In some examples, the passivation layer 424 is planarized using, for example, a chemical mechanical polishing technique, so that a surface 426 of the passivation layer 424 is planar. At operation 612, a thinning operation is performed on the second substrate 418 to subsequently remove the second substrate 418 and the dielectric layer 414 to expose the second surface 408 of the first substrate 400 and the microstructures 410 by using, for example, a chemical mechanical polishing technique and/or an etching technique.

At operation 614, a color filter layer 434 is formed on the second surface 408 of the first substrate 400. The color filter layer 434 includes various color filters, such as red color filters, green color filters and blue color filters, which are arranged in an array. In some embodiments, as shown in FIG. 5F, a dielectric layer 430 is formed to cover the second surface 408 of the first substrate 400, and the color filter layer 434 is then formed on the dielectric layer 430. In certain examples, the dielectric layer 430 has a planar surface 432, and the color filter layer 434 is formed on the planar surface 432. Optionally, a planarization process is performed on the dielectric layer 430 using, for example, a chemical mechanical polishing technique. In some embodiments, a micro-lens layer 436 including micro-lenses 438 is formed on the color filter layer 434 to complete the semiconductor device 440.

According to some embodiments of the present disclosure, a semiconductor device includes a device layer, a semiconductor layer, a sensor element, a dielectric layer, a color filter layer, and a micro-lens. The semiconductor layer is over the device layer. The semiconductor layer has a plurality of microstructures thereon. The sensor element is under the microstructures of the semiconductor layer and is configured to sense incident light. The dielectric layer is over and in contact with the microstructures of the semiconductor layer. The dielectric layer has a substantially planar top surface. The color filter layer is over the dielectric layer. The micro-lens is over the color filter layer.

According to some embodiments of the present disclosure, a semiconductor device includes a device layer, a semiconductor layer, a sensor element, a dielectric layer, a color filter layer, and a micro-lens. The semiconductor layer is over the device layer. The semiconductor layer has a plurality of microstructures thereon. Each of the microstructures has a substantially triangular cross-section. The sensor element is under the microstructures of the semiconductor layer and is configured to sense incident light. The dielectric layer is over the microstructures of the semiconductor layer. The color filter layer is over the dielectric layer. The micro-lens is over the color filter layer.

According to some embodiments of the present disclosure, a semiconductor device includes a device layer, a semiconductor layer, a sensor element, a dielectric layer, a color filter layer, and a micro-lens. The semiconductor layer is over the device layer. The semiconductor layer has a plurality of microstructures thereon. A pitch of the microstructures is in a range from about $\lambda/100$ to about $100\lambda$, and $\lambda$ is a wavelength of an incident light. The sensor element is under the microstructures of the semiconductor layer and is configured to sense the incident light. The dielectric layer is over the microstructures of the semiconductor layer. The color filter layer is over the dielectric layer. The micro-lens is over the color filter layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a device layer;
   a semiconductor layer over the device layer, wherein the semiconductor layer has a plurality of microstructures thereon, and each of the microstructures resembles a triangular pattern from a cross-sectional view, and a first one of the triangular patterns has a leg meeting with a leg of a second one of the triangular patterns to form an angle therebetween;
   a sensor element under the microstructures of the semiconductor layer and configured to sense incident light;
   a dielectric layer over the microstructures of the semiconductor layer, wherein a thickness of the dielectric layer is less than a vertical distance from the sensor element to the plurality of microstructures;
   a color filter layer over the dielectric layer; and
   a micro-lens over the color filter layer.

2. The semiconductor device of claim 1, wherein the dielectric layer has a substantially planar top surface.

3. The semiconductor device of claim 1, wherein a ratio of a height of each of the microstructures to a pitch of the microstructures is in a range from about 1/10000 to about 10000.

4. The semiconductor device of claim 1, wherein a height of each of the microstructures is in a range from about $\lambda/100$ to about $100\lambda$, and $\lambda$ is a wavelength of the incident light.

5. The semiconductor device of claim 1, wherein a pitch of the microstructures is in a range from about $\lambda/100$ to about $100\lambda$, and $\lambda$ is a wavelength of the incident light.

6. The semiconductor device of claim 1, further comprising:
   a passivation layer on a front side of the device layer, wherein the semiconductor layer is on a backside of the device layer; and
   a substrate separated from the device layer by the passivation layer.

7. A semiconductor device, comprising:
   a substrate;
   a device layer over the substrate;
   a passivation layer between the device layer and the substrate;
   a semiconductor layer on a backside of the device layer, wherein the semiconductor layer has a plurality of microstructures on a backside of the semiconductor layer, and when viewed in a cross section, the microstructures form triangular patterns, and any adjacent two of the triangular patterns are immediately adjacent to and in direct contact with each other;
   a sensor element under the microstructures of the semiconductor layer and configured to sense incident light;
   a dielectric layer over the microstructures of the semiconductor layer, wherein a thickness of the dielectric layer is less than a vertical distance from the sensor element to the plurality of microstructures;
   a color filter layer over the dielectric layer; and
   a micro-lens over the color filter layer.

8. The semiconductor device of claim 7, wherein the semiconductor layer forms a zigzagged interface with the dielectric layer.

9. The semiconductor device of claim 8, wherein the color filter layer and the dielectric layer form an interface non-parallel with the zigzagged interface.

10. The semiconductor device of claim 9, wherein the interface formed by the color filter layer and the dielectric layer is flat.

11. The semiconductor device of claim 8, wherein the micro-lens and the color filter layer form an interface non-parallel with the zigzagged interface.

12. The semiconductor device of claim 11, wherein the interface formed by the micro-lens and the color filter layer is flat.

13. The semiconductor device of claim 8, wherein the micro-lens has a convex surface above the zigzagged interface.

14. The semiconductor device of claim 7, wherein the triangular patterns are arranged at a pitch greater than $\lambda/2$, wherein $\lambda$ is a wavelength of the incident light.

15. The semiconductor device of claim 7, wherein a height of each of the triangular patterns is greater than $\lambda/2.5$, wherein $\lambda$ is a wavelength of the incident light.

16. A semiconductor device, comprising:
    a device layer;
    a semiconductor layer over the device layer, wherein the semiconductor layer has a plurality of microstructures distal from the device layer, and each of the microstructures resembles a triangular pattern from a cross-sectional view, and a first one of the triangular patterns has an inclined side contacting an inclined side of a second one of the triangular patterns to form a pointed corner between the first one and the second one of the triangular patterns;
    a sensor element under the microstructures of the semiconductor layer and configured to sense incident light;
    a dielectric layer over the microstructures of the semiconductor layer;
    a color filter layer over the dielectric layer, wherein the color filter layer has a thickness greater than a thickness of a thinnest portion of the dielectric layer; and
    a micro-lens over the color filter layer
    wherein from the cross-sectional view the triangular pattern of each of the microstructures has a vertex separated from the sensor element by a distance greater than the thickness of the thinnest portion of the dielectric layer.

17. The semiconductor device of claim 16, wherein the dielectric layer is in contact with both the inclined sides of the first one and the second one of the triangular pattern.

18. The semiconductor device of claim 17, wherein the dielectric layer is further in contact with the pointed corner between the first one and the second one of the triangular patterns.

19. The semiconductor device of claim 16, wherein the triangular patterns are arranged at a pitch greater than $\lambda/2$, wherein $\lambda$ is a wavelength of the incident light.

20. The semiconductor device of claim 16, wherein the distance separating the vertex of the triangular pattern from the sensor element is also greater than a thickness of a thickest portion of the dielectric layer.

* * * * *